(12) United States Patent
Appelt et al.

(10) Patent No.: US 8,248,068 B2
(45) Date of Patent: Aug. 21, 2012

(54) HYPERPOLARIZATION OF LITHIUM AND OTHER NUCLEI

(75) Inventors: Stephan Appelt, Jülich (DE); Wolfgang Häsing, Jülich (DE); Ulrich Sieling, Düren (DE); Holger Kühn, Leverkusen (DE)

(73) Assignee: Forschungszentrum Juelich GmbH, Juelich (DE)

( * ) Notice: Subject to any disclaimer, the term of this patent is extended or adjusted under 35 U.S.C. 154(b) by 793 days.

(21) Appl. No.: 11/918,853

(22) PCT Filed: Mar. 25, 2006

(86) PCT No.: PCT/DE2006/000531
§ 371 (c)(1),
(2), (4) Date: Jan. 28, 2009

(87) PCT Pub. No.: WO2006/111126
PCT Pub. Date: Oct. 26, 2006

(65) Prior Publication Data
US 2009/0261822 A1    Oct. 22, 2009

(30) Foreign Application Priority Data
Apr. 18, 2005 (DE) .......................... 10 2005 017 927

(51) Int. Cl.
*G01V 3/00* (2006.01)
(52) U.S. Cl. ...................................... 324/304
(58) Field of Classification Search ........... 324/300–322
See application file for complete search history.

(56) References Cited

U.S. PATENT DOCUMENTS

| 2,665,412 A | * | 1/1954 | Eding et al. | .................. 324/71.1 |
| 3,983,182 A | * | 9/1976 | Lagow | .................. 260/665 R |
| 5,642,625 A | * | 7/1997 | Cates et al. | .................. 62/55.5 |
| 6,318,092 B1 | * | 11/2001 | Happer et al. | .................. 62/55.5 |
| 2009/0261822 A1 | | 10/2009 | Appelt et al. | |

FOREIGN PATENT DOCUMENTS
WO  WO 03/071946 A1 *  9/2003

OTHER PUBLICATIONS

Neugart, R., Spin exchange polarization and measurement of the hyperfine splitting of short-lived 8Li, Zeitschrift fur Physik (Atoms and Nuclei), vol. 261, No. 3, p. 237-48, 1973.*

* cited by examiner

*Primary Examiner* — Melissa Koval
*Assistant Examiner* — Daniel Miller
(74) *Attorney, Agent, or Firm* — Jonathan Myers; Andrew Wilford (57) ABSTRACT

The invention concerns a method for hyperpolarizing lithium atoms in a mixture by optically pumping, in a sampling cell, atoms of a first type or alkali metal and by spin exchange between the optically pumped electron of the alkali metal and the lithium atom electron. The lithium atoms are preferably oxidized into $Li^+$ ions and accumulated. The nuclear spin polarization of the $Li^+$ ions can be transmitted to a nuclear spin of an anion. The invention also concerns a method for producing substances with nuclear spin polarization in general. In accordance with said method, lithium atoms are optically pumped from atoms of a first type of alkali metal in a sampling cell and hyperpolarized by spin exchange between the optical pumped electron of the alkali metal and the lithium atom electron, the lithium atoms being then oxidized into $Li^+$ ions. Then, the nuclear spin polarization of the $Li^+$ ions is transmitted to another nucleus of an anion. Thus it is possible to obtain hyperpolarized nuclei such as, for example, $^{13}C$, $^{31}P$ or $^{29}Si$ in solid or liquid phase, in large amounts and at high polarizing levels.

36 Claims, 7 Drawing Sheets

Figure 6 is a schematic diagram showing a reactor for producing hyperpolarized Li+. Reaction of polarized lithium atoms with water vapor molecules and subsequent condensation.
T1 ~ 11 min for 6Li+ in H2O or D2O.

1. He Reservoir
2. Valve
3. 4He gas stream
4. Rb reservoir (T ~ 200oC)
5. Rb-4He gas stream
6. Li reservoir (T ~ 900oC)
7. Li-Br-4He gas stream
8. Circular polarizing laser (795 nm Rb D1 Line)
9. Feed line for injecting water vapor
10. Cold trap
11. Al2O3 (sapphire)-coated quartz tube
12. Condensate Li+, Rb+, H2O, OH-
13. Waste gas 4He, H2
14. Magnetic field

Figure 5 is a schematic diagram showing an Rb-LI jet polarizer that has been modified for producing hyperpolarized lithium atoms by indirect optical pumping of alkali metals using an oxidizing agent Ox (Ox = D2, H2, Cl2) and subsequenbt deposition of LiOx molecules, T1 > 40 min for LiCl, respectively > 1 hour for LiD at 0.5T.

Fig. 5

Figure 6 is a schematic diagram showing a reactor for producing hyperpolarized Li+. Reaction of polarized lithium atoms with water vapor molecules and subsequent condensation.
T1 ~ 11 min for 6Li+ in H2O or D2O.

1. He Reservoir
2. Valve
3. 4He gas stream
4. Rb reservoir (T ~ 200oC)
5. Rb-4He gas stream
6. Li reservoir (T ~ 900oC)
7. Li-Br-4He gas stream
8. Circular polarizing laser (795 nm Rb D1 Line)
9. Feed line for injecting water vapor
10. Cold trap
11. Al2O3 (sapphire)-coated quartz tube
12. Condensate Li+, Rb+, H2O, OH-
13. Waste gas 4He, H2
14. Magnetic field

Fig. 6

1. Sapphire tube or sapphire-coated quartz tube
2. Free jet 4He, N2, Rb, Li
3. Circular polarizing laser with light of D1 line with Rb
4. Storage tank with gas-forming oxidizing agents (e.g. 4He, Cl2) or a liquid oxidizing agent (e.g. H2 O)
5. Porous partition for introducing the oxidizing agents
6. Reaction zone
7. Gas and reaction product (e.g. 4He, N2, RbCl, LiCl, Cl2 )
8. Isolated solid reaction products (e.g. RbCl, LiCl)
9. Waste gas (e.g. 4He, N2, Cl2)
10. Cooling water in
11. Cooling water out
12. Valve
13. Cooling medium (e.g. liquid N2)
14. Hallbach Magnet ~ 0.4T

Fig. 7

HYPERPOLARIZATION OF LITHIUM AND OTHER NUCLEI

CROSS REFERENCE TO RELATED APPLICATIONS

This application is the US national phase of PCT application PCT/DE2006/000531, filed 25 Mar. 2006, published 26 Oct. 2006 as WO 2006/111126, and claiming the priority of German patent application 102005017927.4 itself filed 18 Apr. 2005, whose entire disclosures are herewith incorporated by reference.

FIELD OF THE INVENTION

The invention relates to the hyperpolarization of lithium and other nuclear spins characterized by long longitudinal $T_1$ relaxation times, for example $^{13}C$, $^{29}Si$, and $^{31}P$.

BACKGROUND OF THE INVENTION

Recent developments in magnetic resonance tomography (MRT) and [nuclear] magnetic resonance (NMR) spectroscopy using polarized noble gases have many applications in medicine, physics, and in the physical sciences. Noble gas nuclei may be polarized by optical pumping using alkali metal atoms, as described by Happer et al in Phys. Rev. A, 29, 3092 (1984).

The concept of optical pumping encompasses the method developed by Kastler, in which the occupation numbers of specific energy states are significantly increased with respect to the equilibrium state by irradiation of light into matter. By use of optical pumping, the relative occupation numbers of energy levels in atoms, ions, molecules, and solids may be changed, and ordered states may be produced. The occupation density of the optically pumped state differs markedly from the thermal occupation probability of the state according to the Boltzmann distribution. By optical pumping of Zeeman levels it is possible, for example, to achieve a parallel configuration of the magnetic moments of the electrons or atomic nuclei.

In practice, the alkali metal atom rubidium is typically used in the presence of the noble gases helium and nitrogen. In this manner it is known to achieve a nuclear spin polarization of approximately 20% for $^{129}Xe$, for example. Such a nuclear spin polarization is approximately 100,000 times larger than the equilibrium polarization in clinical magnetic resonance tomography at 1 T and 300 K. The associated drastic increase in the signal-to-noise ratio is the reason that new application options are in demand in medicine, science, and technology.

The term "polarization" is understood to mean the degree of alignment (ordering) of the spins of atomic nuclei, electrons, or photons. For example, 100% polarization means that all nuclei or electrons are identically oriented. A magnetic moment is associated with the polarization of nuclei or electrons.

Hyperpolarization refers to a polarization level of nuclear or electron spins that is greater than the degree of thermal polarization of the spins in a given magnetic field at room temperature.

Hyperpolarized noble gases are used as contrasting agents or for NMR spectroscopy. For example, hyperpolarized $^{129}Xe$ is inhaled by or injected into a person. The polarized xenon accumulates in the brain 10 to 15 seconds later. The distribution of the noble gas in the brain is determined by use of magnetic resonance tomography, and the results are used for further analyses.

The selection of the noble gas depends on the particular application. $^{129}Xe$ has a large chemical shift. When xenon is adsorbed onto a surface, for example, the resonance frequency of the xenon is significantly altered. In addition, xenon is soluble in lipophilic liquids. Xenon is used when such characteristics are desired.

The noble gas helium has very low solubility in liquids. Therefore, the isotope $^3He$ is routinely used when cavities are involved. The human lung represents an example of such a cavity.

Some noble gases have valuable properties other than those stated above. For example, the isotopes $^{83}Kr$, $^{21}Ne$, and $^{131}Xe$ have a quadrupole moment that is of interest, for example, for experiments in basic research or surface physics. However, these noble gases are very costly, which makes them unsuitable for applications that use large quantities.

It is known from Driehuys et al (Appl. Phys. Lett. (1996), 69, 1668) to polarize noble gases in a polarizer in the following manner.

Starting with a gas supply, a gas stream composed of a mixture of $^{129}Xe$, $^4He$, and $N_2$ in an Rb container is enriched with Rb vapor and passed through a pump cell. Circularly polarized light, i.e., light in which the angular momentum or the photon spin is aligned in the same direction, is provided by a laser. In the pump cell the Rb atoms as a pumpable species are optically pumped longitudinally with respect to a magnetic field by means of the laser beam ($\lambda \sim 795$ nm, Rb D1 line), thereby polarizing the electron spins of the Rb atoms. The angular momentum of the photons is transferred to free electrons of alkali metal atoms. The spins of the electrons of the alkali metal atoms thus have a large deviation from thermal equilibrium. The alkali metal atoms are consequently polarized. Collision of an alkali metal atom with a noble gas atom causes the polarization of the electron spin to be transferred from the alkali metal atom to the noble gas atom, resulting in a nuclear spin-polarized noble gas. The polarization of the electron spin of the alkali metal atoms produced by the optical pumping of alkali atoms is thus transferred from alkali electrons to the nuclear spin of the noble gases by spin exchange, as first demonstrated by Bouchiat on the Rb/$^3$He system.

From WO 1999/008766 it is known to use, in addition to a first optically pumpable alkali metal, an auxiliary alkali metal as a second polarizable species. The optically pumped alkali metal species transfers the electron spin polarization to the auxiliary alkali metal, thereby more effectively and rapidly transferring the alkali polarization to the noble gas nuclei, for example $^3He$.

Alkali metal atoms are used because they have a large optical dipole moment that interacts with the light. The alkali metal atom also has one free electron, thus preventing disadvantageous interactions from occurring between two or more electrons per atom.

Cesium, which is superior to rubidium for achieving the above-referenced effects, might be considered as a well-suited alkali metal atom. However, lasers matched to the optical wavelength of Cs and having sufficient power necessary for polarization of xenon by cesium are not prevalent on the market, compared to the corresponding lasers for Rb.

In order to utilize as many photons as possible in the use of broadband high-power semiconductor lasers, pressures of several atmospheres are used in the optical pumping of noble gases. Thus, the optical pumping of alkali metal atoms differs, depending on the type of the noble gas to be polarized.

For polarization of $^{129}Xe$, a gas mixture under a pressure of approximately 7 to 10 bar is continuously or semicontinuously passed through a cylindrical glass cell. The gas mixture is composed of 94% $^4$He, 5% nitrogen, and 1% xenon. The flow rate of the gas mixture is typically 1 cm per second.

Hyperpolarized nuclear and electron spins relax more or less rapidly as a function of their environment. A distinction is made between the longitudinal $T_1$ relaxation time ($T_1$ time for short), referred to as spin lattice relaxation of adjacent spins, and the transverse $T_2$ relaxation time, referred to as spin-spin relaxation.

In the case of polarization of $^3$He, the pressure required in the polarizer is produced by the $^3$He itself since the electron spin relaxation rate of Rb—$^3$He collisions is small. This is not is the case for spin exchange pumping of Rb—$^{129}$Xe, for which reason the pressure is produced by an additional buffer gas such as $^4$He. Various requirements are imposed on the polarizer as the result of the differing relaxation and spin exchange rates.

Thus, for $^3$He the nuclear spin polarization build-up times are in the range of hours. However, since the rubidium spin decomposition rate for rubidium-$^3$He collisions is also relatively small, in this case high $^3$He pressures (>5 bar) may be used.

For $^{129}$Xe, on the other hand, the nuclear spin polarization build-up times are between 20 and 40 seconds on account of the larger effective spin exchange cross-sectional area. Due to the very large rubidium electron spin relaxation rate for rubidium-xenon collisions, during the optical spin exchange pumping the xenon partial pressure can only slightly exceed 100 mbar in order to maintain a sufficiently high rubidium polarization. For this reason, in such polarizers $^4$He is used as a buffer gas for line broadening.

The polarizer may be designed as a flow polarizer for polarizing $^{129}$Xe, for example, or may be provided with a sealed sample cell for $^3$He, for example.

In a flow polarizer, the gas mixture initially flows through a vessel, referred to hereinafter as a "supply vessel," in which a certain quantity of Rb is present. The supply vessel containing the rubidium together with the connected glass cell is heated to approximately 100 to 170 degrees Celsius. At these temperatures the rubidium is vaporized. The concentration of the vaporized rubidium atoms in the gaseous phase is determined by the temperature in the supply vessel. The gas stream transports the vaporized rubidium atoms from the supply vessel into a cylindrical sample cell, for example. A laser that provides a high-power, circularly polarized light and having a power rating of approximately 50-100 watts continuously irradiates the sample cell in an axial direction, i.e., in the direction of flow, and optically pumps the rubidium atoms in a highly polarized state. The wavelength of the laser must be matched to the optical absorption line of the rubidium atoms (D1 line).

In other words, in order to optimally transfer the polarization of light to an alkali metal atom, the frequency of the light must match the resonance frequency of the optical transition.

The sample cell is located in a static magnetic field $B_o$ of approximately 10 gauss, which is generated by coils, in particular by a Helmholtz coil pair. The direction of the magnetic field extends parallel to the cylindrical axis of the sample cell, i.e., parallel to the beam direction of the laser. The magnetic field is used to guide the polarized atoms. The rubidium atoms that are optically highly polarized by the laser light collide in the glass cell with the xenon atoms, among other species, and transfer their polarization to the xenon atoms.

At the outlet of the sample cell, the rubidium deposits on the wall due to its high melting point compared to the melting points of the other gases. The polarized xenon or the residual gas mixture is conveyed from the sample cell into a freezer unit, which is composed of a glass flask immersed at one end in liquid nitrogen. The glass flask is also situated in a magnetic field having an intensity of >1000 gauss. The highly polarized xenon gas deposits as ice on the inner glass wall of the freezer unit.

The flow rate in the entire system may be controlled via a needle valve and measured with a measuring instrument.

If the increase in the flow rate is excessive, there is not enough time to transfer the polarization from the rubidium atoms to the xenon atoms, resulting in low polarization. If the flow rate is too low, too much time elapses until the desired quantity of highly polarized xenon is frozen. The polarization of the xenon atoms therefore decreases as the result of relaxation in the Xe ice. The relaxation of the xenon atoms is greatly retarded by freezing, as well as by a strong magnetic field to which the freezer unit is exposed. Therefore, after the polarization the noble gas xenon must be frozen as rapidly as possible with minimization of loss. Although the relaxation cannot be completely prevented by freezing, at 77 K there is a period of approximately 1 to 2 hours before the xenon polarization has decreased so greatly that the initially highly polarized gas can no longer be used.

A certain amount of energy is required to polarize a single free alkali metal atom. The required energy corresponds to the resonance frequency for elevating the free electron of the alkali metal atom from a ground state to an excited state. In order to optimally transfer the energy from a laser to the alkali metal atom, the frequency of the light from the laser must be matched to the resonance frequency of the alkali metal atom. Some lasers emit light within a specific frequency spectrum. Thus, a distribution of frequencies, not a single frequency, is involved. The available spectrum of a laser is characterized by the line width. For cost-effective polarization of alkali metal atoms, broadband semiconductor lasers are provided whose frequency and line width are matched to the resonance frequency, i.e., the optical line width, of the alkali metal atom.

To enable better transfer of the energy from a laser to alkali metal atoms, collision partners are provided for the alkali metal atoms during the polarization. $^4$He atoms in particular are used as collision partners. The optical line width of an alkali metal atom is broadened as a result of the interaction, i.e., the collisions, with the helium atoms. The broader this atomic spectrum, the greater the spectral width, and therefore the lower the cost, of the lasers that can be used.

The number of collisions between an alkali metal atom and a collision partner such as $^4$He increases with increasing pressure. For $^4$He, for example, the broadening of the optical line width of the alkali metal atom is proportional to the pressure of the helium gas. In addition, $^4$He has the valuable characteristic that it has a minimal destructive influence on the polarization of the alkali metal atoms. For the polarization of $^{129}$Xe, therefore, a gas mixture is routinely used that is composed of 94% $^4$He and has a pressure of approximately 10 bar.

The laser known from the prior art, having a power of 100 watts for the hyperpolarization of Rb electrons, is a glass fiber-coupled diode laser having a typical spectral width of 2 to 4 nanometers. At a gas pressure of 10 bar, the line width of the optical transition of rubidium atoms is broadened to approximately 0.3 nanometers. Thus, in the present rubidium-xenon polarization, in which high-power diode lasers are used for optical pumping which typically have a line width of 2 nanometers, only a fraction of the laser light is utilized.

The partial pressure of $^4$He in the gas mixture is less than or equal to 10 bar. This is very high compared to the other partial pressures (xenon and nitrogen). As a result, polarized alkali metal or noble gas atoms rarely reach the inner wall of the glass cell, where they lose their polarization due to interaction with the paramagnetic centers, for example. Thus, with increasing partial pressure of the $^4$He, the lower the probability that polarized atoms disadvantageously collide with the inner wall of the cell.

A polarized alkali metal atom such as rubidium, for example, is able to generate fluorescent radiation. When such radiation is intercepted by another polarized alkali metal atom, this capture results in depolarization of the alkali metal atom. The nitrogen used in the gas mixture for the polarization of noble gases is used to hinder the fluorescent light and thus the capture of radiation. The element nitrogen in the gas mixture, the same as for xenon, has a low partial pressure. This partial pressure is typically approximately 0.1 bar.

For heavy noble gas atoms such as xenon atoms, collision with the alkali metal atoms causes intense relaxation of the polarization of the alkali metal atoms. To keep the polarization of the alkali metal atoms as high as possible during optical pumping, the partial pressure of the xenon gas in the gas mixture must be correspondingly low. Even for a xenon partial pressure of 0.1 bar in the gas mixture, a laser power of approximately 100 watts is required to achieve approximately 70% polarization of the alkali metal atoms in the entire sample volume.

According to the prior art, a gas volume of appropriate composition is injected into a cylindrical sample cell. The light from the laser that produces the polarization is absorbed in the sample cell. The pump beam irradiates the sample cell in the direction of flow of the mixture, which includes the optically pumpable species and the atomic nuclei to be hyperpolarized, parallel to the magnetic field.

In contrast, it is known from US 2002/0107439 A1 to irradiate the sample cell with laser light in counterflow to the flowing mixture.

In biological systems, short longitudinal $T_1$ times of the noble gas nuclei in the blood, as well as the low solubility in aqueous solutions, severely limit the use of hyperpolarized noble gases. For example, for medical applications it has not been possible thus far to transport $^{129}$Xe with sufficient polarization density into the brain, since the $T_1$ times in the blood are short (~10 s), and the transport technology for this purpose is very complex or has not been developed at all. The same applies for the other noble gases under discussion.

DE 102 38 637 A1 describes a method for producing nuclear spin-polarized liquids. A polarized Li atomic beam is generated by optical pumping or by use of a Stern-Gerlach apparatus, and is directed onto the liquid.

However, it is disadvantageous that the maximum achievable density of lithium atoms in the atomic beam is only $10^{13}$ cm$^{-3}$. In addition, the method functions only at low pressures <$10^{-3}$ mbar. This greatly limits the total number of polarized Li atoms or ions that are produced (<$10^{15}$).

For use of hyperpolarized $^6$Li and also $^7$Li in the life sciences and material sciences, the production and storage of large quantities of approximately 1019 hyperpolarized Li$^+$ ions or Li atoms is desirable.

OBJECTS OF THE INVENTION

An object of the present invention is to provide a method for hyperpolarization of lithium that results in a much higher density, i.e., total number, of polarized lithium atoms or ions.

A further object of the invention is to provide a general method for producing large quantities of hyperpolarized substances in the solid or liquid state.

SUMMARY OF THE INVENTION

The method according to the invention for hyperpolarization of lithium atoms in a mixture by optical pumping in a sample cell is characterized by optical pumping of a first type of alkali metal using laser light. Spin exchange of the optically pumped electron of the first type of alkali metal is transferred to the electron of the lithium atom in the original condition.

As described below, in this manner the hyperpolarized noble gases, known from the prior art and associated with significant disadvantages as demonstrated above, may be replaced as contrasting agents.

As shown in Table 1, a number of alkali metals may be optically polarized in the vapor phase, with varying degrees of difficulty. When the alkali metals are present as singly positively charged ions, in salts, for example, with few exceptions (LiF, for example) they are also very soluble in water.

All nuclei of alkali metal atoms have an electric nuclear quadrupole moment. $^7$Li$^+$, $^{23}$Na$^+$, $^{41}$K$^+$, and Rb$^+$ ions, however, have a relatively large nuclear quadrupole moment in the range of 0.1 e*$10^{-24}$ cm$^2$, so that their nuclear spin polarization in aqueous solution is relatively rapid, i.e., decomposes after approximately 10 ms (Na$^+$) to 18 seconds ($^7$Li$^+$) due to the strong quadrupole interaction. Although $^{133}$Cs$^+$ has a small nuclear quadrupole moment (4*$10^{-3}$ e*$10^{-24}$ cm$^2$), the nuclear spin polarization nevertheless decomposes rapidly on account of the large Sternheimer factor. The Sternheimer factor describes the intensification of the electrical field gradients as the result of collisions with the electron shell of the Cs ion.

From this standpoint, it has been found that the $^6$Li$^+$ ion is an exceptional candidate. This ion has a very small nuclear quadrupole moment (4.6*$10^{-4}$ e*$10^{-24}$ cm$^2$) and a small Sternheimer factor. In addition, it has a low gyromagnetic ratio of 0.62 kHz/G.

As a result, the $T_1$ times of the $^6$Li$^+$ ion may be very long, and range from approximately 10 min in the aqueous phase to more than 2000 h for $^6$LiD solids (for B=0.4 T and T<1 K).

Because hyperpolarized $^6$Li$^+$ is relatively inexpensive, has a long $T_1$ time, and is so small that it diffuses into cells, porous matter, and nanochannels and ion channels essentially without loss with respect to the nuclear spin polarization, as an NMR tracer it is a better alternative than any of the hyperpolarized noble gases.

Within the scope of the invention, it has also been found that Li atoms cannot be directly optically pumped at high densities. As shown in Table 1, for the lithium atom the optical $D_1$ and $D_2$ energy levels are very close to one another (only 0.12 nm).

This means that even at moderate buffer gas pressures (>50 mbar He gas) and at high lithium concentrations (>$10^{12}$ cm$^3$) the $D_1$ or $D_2$ lines of lithium overlap due to the collision broadening. As a result, for example for circularly polarized pump light, both original conditions of the Li atom are simultaneously depopulated and the resulting overall polarization of the Li original condition is therefore virtually zero.

TABLE 1

Physical properties of the alkali metal atoms, where
$\eta_{alk}$: Isotope frequency
I: Nuclear spin
$\gamma_{alk}$: Gyromagnetic ratio
$D_1$ line: Optical transition of $^2S_{1/2} \rightarrow {}^2P_{1/2}$
$D_2$ line: Optical transition of $^2S_{1/2} \rightarrow {}^2P_{3/2}$
$\omega_{hf}$: Hyperfine splitting of the original condition

| Species | $\eta_{alk}$ | I | $\gamma_{alk}/2\pi$ (kHz/G) | D1 line (nm) | D2 line (nm) | $\omega_{hf}/2\pi$ (MHz) |
|---|---|---|---|---|---|---|
| $^6$Li | 0.075 | 1 | 934.16 | 670.78 | 670.66 | 228.2 |
| $^7$Li | 0.925 | 3/2 | 700.621 | 670.78 | 670.66 | 803.5 |
| $^{23}$Na | 1.0 | 3/2 | 700.621 | 589.59 | 588.99 | 1771.6 |
| $^{39}$K | 0.931 | 3/2 | 700.621 | 769.90 | 766.49 | 461.72 |
| $^{41}$K | 0.0688 | 3/2 | 700.621 | 769.90 | 766.49 | 254.01 |

TABLE 1-continued

Physical properties of the alkali metal atoms, where
$\eta_{alk}$: Isotope frequency
I: Nuclear spin
$\gamma_{alk}$: Gyromagnetic ratio
$D_1$ line: Optical transition of $^2S_{1/2} \to {}^2P_{1/2}$
$D_2$ line: Optical transition of $^2S_{1/2} \to {}^2P_{3/2}$
$\omega_{hf}$: Hyperfine splitting of the original condition

| Species | $\eta_{alk}$ | I | $\gamma_{alk}/2\pi$ (kHz/G) | D1 line (nm) | D2 line (nm) | $\omega_{hf}/2\pi$ (MHz) |
|---|---|---|---|---|---|---|
| $^{85}$Rb | 0.7215 | 5/2 | 467.081 | 794.76 | 780.02 | 3035.73 |
| $^{87}$Rb | 0.2785 | 3/2 | 700.621 | 794.76 | 780.02 | 6834.68 |
| $^{133}$Cs | 1.0 | 7/2 | 350.31 | 894.35 | 852.11 | 9192.63 |

Thus, in the course of the method according to the invention, to begin with a first type of alkali metal (AM), for example Rb or K or also Cs, is advantageously optically pumped. This first type of alkali metal is pumped very effectively at moderate densities of $<10^{15}$ cm$^{-3}$; i.e., the polarization level is very high (>80%).

Within the scope of the invention, it has also been found that a spin exchange may occur between the optically pumped electron of the first type of alkali metal atom in the original condition and the electron of the lithium atom in the original condition, whereby the density of the Li atoms may be very high. This polarization exchange between Rb and Li occurs at a rate of $\gamma_{ex}^{Rb, Li}$.

It has been found that indirect optical pumping between the referenced alkali metal atoms and lithium atoms functions particularly well when the very corrosive, hot lithium vapor is passed into the sample cell in a controlled manner, i.e., while essentially preventing wall contact and Li wall relaxation, and is allowed to interact with the alkali metal of the first type, for example Rb, K, or Cs. In this regard an apparatus was modified for carrying out the method, as described in greater detail below.

Compared to the prior art, it is advantageous that for the method according to the invention no vacuum is required for the Li polarization and accumulation process, and the density of the Li atoms may be set at a level that is higher than the prior art by a factor of $10^3$.

For the indirect optical pumping according to the invention, using the first alkali metal, the Li particle concentration in the sample cell may be advantageously selected to be very high, for example at least $10^{15}$ cm$^{-3}$ for a temperature of ~600° C. Concentrations of $10^{16}$-$10^{18}$ cm$^{-3}$ are preferably set for temperatures of ~750-1200° C. The lithium atoms are still indirectly polarized in an efficient manner at a moderate density of the first type of alkali metal.

To this end, Cs, Rb, or K may be used at a density between approximately $10^{12}$ and $10^{15}$ cm$^{-3}$ (temperatures of alkali metal vaporization: Cs: T=70-180° C., Rb: T=100-200° C., K: T=200-300° C.), since in that case the spin exchange rate $\gamma_{ex}^{AM,Li}$ is greater than the polarization-destroying rates $\gamma_{sd}$ of the alkali metal electron spins.

The method according to the invention provides, in a particularly advantageous manner, hyperpolarized lithium atoms in a correspondingly higher density and with a high polarization level of >50%.

In one very particularly preferred embodiment of the invention, however, hyperpolarized lithium atoms may also be oxidized in a further method step, thereby advantageously providing the appropriate quantities of Li$^+$ ions, and, particularly advantageously, may be accumulated. The advantage of the oxidation is that the $T_1$ times for the nuclei of the Li ions are longer by several orders of magnitude, for example $10^5$ times longer, than the $T_1$ relaxation time of the Li atoms.

Li$^+$ ions may thus be accumulated in a particularly advantageous manner. The Li$^+$ ions may be used as hyperpolarized MRT contrasting agents by dissolving them in suitable, in particular biocompatible, solvents.

Starting with the polarized lithium vapor present in high density, one electron is removed from each lithium atom by oxidation without destroying the Li nuclear spin polarization.

It is particularly advantageous for the nuclear spin polarization of the Li atom to be maintained during the electron transfer process, despite the redox reaction.

To this end, within the scope of the invention use has been made of the hyperfine coupling constant of the affected Li atoms. The relationship consists in the fact that the nuclear spin of the $^6$Li atom at its shell electron is coupled to a hyperfine coupling constant of 228 MHz (see Table 1). In other words, a hyperfine period of the hyperfine interaction lasts approximately 4.3 ns. Since this period is more than 1000 times longer than the time for the electron transfer (several ps), the nuclear spin is essentially not influenced at all, and the nuclear spin polarization is therefore maintained. In this manner large quantities of $^6$Li nuclear spin polarization may be produced, accumulated, and stored.

A polarization level of 1-90% for the Li nuclei in a solid or also in a suitable liquid may thus be easily achieved.

Examples of suitable oxidizing agents are $D_2$, $H_2$, or $Cl_2$ gas. The oxidizing agent is introduced into the outlet of the sample cell, for example, and oxidizes the hyperpolarized lithium atoms to Li molecules, i.e., salts. The resulting polar lithium molecules (salts), for example LiD, LiH, LiCl, which depend on the oxidizing agent, are led into a cold trap. Depending on the phase of the coolant, the lithium molecules are dissolved or precipitate directly as lithium salt in the form of a solid in the cold trap.

In particular, the hyperpolarized $^6$Li$^+$ nuclei in the solid may have an extremely long $T_1$ time, which for LiD, for example, is greater than 2000 h for a magnetic field of 0.4 T and temperatures <1 K. For T=77 K, $T_1$ is approximately several hours.

The further intended use determines the type of treatment following production of these polarized lithium ions. Thus, in no way is the potential of the invention exhausted.

Rather, the hyperpolarized Li salt prepared in this manner may be used for producing other hyperpolarized substances in the liquid or solid states by transferring the nuclear spin polarization of the Li$^+$ ions to a nuclear spin of an anion, as described below.

A general method for this purpose comprises the following steps:

Lithium atoms are hyperpolarized by optical pumping of a first type of alkali metal in a sample cell, using laser light, and by spin exchange of the optically pumped electron of the first alkali metal atom to the electron of the lithium atom, The lithium atoms are oxidized to Li$^+$ ions while maintaining the nuclear spin polarization of the lithium ions, The polarization of the Li$^+$ ions is transferred to the nuclear spin of an anion A in the corresponding Li$_x$A$_y$ solid (x, y being integers).

Therefore, the following discussion correspondingly refers to the method according to the main claim and equivalent claim.

For the hyperpolarization of the lithium atom, besides the first type of alkali metal and lithium the mixture introduced into the sample cell also includes $N_2$ and $^4$He, for example. By means of circularly polarized laser light, first the $D_1$ line of the first type of alkali metal in the vapor phase is optically excited, and the spin of the valence electrons of the alkali metal atoms is polarized to a high degree. The entire mixture of alkali metal and lithium vapor in addition to $N_2$ and $^4He$ is continuously passed through the heated sample cell. The added $N_2$ suppresses the fluorescence of the first type of alkali metal in the manner of a quench gas.

The $^4He$ gas is used as buffer gas and for broadening the pressure of the $D_1$ line of the atoms of the first type of alkali metal, and thus for effective absorption of the broadband laser radiation used.

In one particularly advantageous embodiment of the invention, the mixture may include $^3He$, the nuclear spin of the $^3He$ gas being polarized by the indirectly optically pumped Li atoms. The polarization occurs via the $^6Li$ (or $^7Li$)—$^3He$ hyperfine interaction. In this regard it is advantageous that for $10^{17}$ lithium atoms, for example, the speed of polarization of the $^3He$ nuclei is significantly greater (spin-up time: <1 h).

An inexpensive semiconductor laser having a typical optical line width of 1-4 nm may be used as a pump laser in a very advantageous manner.

After flowing through the sample cell, the hyperpolarized lithium is oxidized using an oxidizing agent, as described, and the resulting Li molecules are separated as Li salt in a separator and in a magnetic field >0.05 T, and accumulated over the duration of the process. Other gaseous products are discharged as exhaust gas, for example.

By use of the method, $^6Li$ atoms as well as $^7Li$ atoms may advantageously be hyperpolarized, oxidized into their corresponding ions, and accumulated.

In general, the lithium atoms having a density of at least $10^{14}$ cm$^{-3}$ and the first type of alkali metal having a density of at least $10^{12}$ cm$^{-3}$ are led into the sample cell and optically pumped, as a result of which spin exchange occurs.

Such high Li concentrations ensure that a sufficient quantity of hyperpolarized Li compounds may be produced in the maximum accumulation times resulting from the long $T_1$ times of the hyperpolarized Li compounds.

To convert lithium to the gaseous phase, the hyperpolarization is carried out at >500° C., in particular at approximately 900° C.

The density of lithium atoms in the sample cell increases with increasing temperature, and may be adjusted in a targeted manner as a function of the temperature.

The lithium atoms are oxidized to Li$^+$ ions in a particularly advantageous manner by adding oxidizing agents, for example $Cl_2$, $I_2$, $Br_2$, $D_2$, $H_2$, or organic oxidizing agents. Depending on the choice of oxidizing agent, the corresponding lithium salt is advantageously produced by the oxidation. The Li atoms are accumulated in relevant quantities (for example, up to $10^{19}$) in the form of a corresponding lithium salt by continuous oxidation and introduction of the gas mixture into a cold trap, using $N_2$ or $H_2O$, for example, as coolant, in a magnetic field >0.05 T.

A polarization level of 1-90% for the Li nuclei in the solid, or also in a suitable liquid, may thus be easily achieved.

The lithium salt produced according to the invention may then be used in a very particularly advantageous manner as a polarization medium for hyperpolarization of nuclei of another anion. The nuclear spins of the anions advantageously have long T$_1$ times, and may therefore be stored or optionally dissolved in solvents for use in imaging methods or NMR spectroscopy.

In particular, the nuclei $^{13}C$, $^{31}P$, $^{29}Si$, and some Al nuclei that are important for nuclear spin resonance and that are characterized by long $T_1$ times may be produced at polarization levels of greater than 1% and in relevant quantities of, for example, $10^{15}$ atoms, ions, or molecules. Polarization levels of >50% may be achieved in this manner.

If, for example, nuclear spin-polarized $^6Li^+Cl^-$ prepared according to the invention is combined in aqueous solution with other anions A (where A is $CO_3^{2-}$, $SiO_4^{4-}$, $PO_4^{3-}$, $Al_2O_3$, for example), subsequent evaporation of the solvent results, for example, in the corresponding $Li_xA_y$ salts $Li_2CO_3$, $Li_4SiO_4$, and $Li_3PO_4$, among others. It is noted that this method is possible only when $^6Li$ is used as polarization medium, since the dissolution and evaporation processes last several minutes, and during this time the lithium nuclear spin polarization should not be lost (T$_1$ of $^6Li$ in $H_2O$: ~10 min).

Thus, all nuclei having long longitudinal T$_1$ times, i.e., for the nuclei $^6Li$, $^{13}C$, $^{29}Si$, and $^{31}P$, etc., in the $Li_xA_y$ solid or in solution are particularly advantageous for this method. It is particularly advantageous for the T$_1$ times of the referenced nuclei to range from minutes to hours. Examples of T$_1$ times for Li compounds are listed in Table 2.

TABLE 2

T$_1$ relaxation times in solids for the nuclei $^6Li$, $^7Li$, $^{13}C$, $^{31}P$, and $^{29}Si$

| Compound | Nucleus | T$_1$ time (min) |
|---|---|---|
| LiF | $^7Li$ | 5 |
| LiCl | $^7Li$ | 40 |
| LiD | $^6Li$ | >60 |
| $Li_2CO_3$ | $^{13}C$ | >20 |
| XPO$_4$ | $^{31}P$ | >1 |
| XSiO$_4$ | $^{29}Si$ | >30 |

In the ionic $Li_xA_y$ solid, the large Li$^+$ nuclear spin polarization may then be transferred to the $^{13}C$, $^{29}Si$, or $^{31}P$ nuclear spin in a highly efficient manner by means of cross polarization or also by use of the field cycling method.

In this manner, up to 50% of the Li nuclear spin polarization is transferred to the other nuclei.

Cross polarization is a standard method in which coherent polarization is transferred from a spin type A to a spin type B by means of two radio frequency pulses. For large magnetic fields, the matching condition, also referred to as the Hartmann-Hahn condition, must be satisfied for both spin types. The Hartmann-Hahn condition is satisfied when, for the amplitudes of the two radio frequency pulses $H_1^A$ and $H_1^B$ of spin types A and B, the condition $\gamma_A H_1^A = \gamma_B H_1^B$ is met. $\gamma_A$ and $\gamma_B$ are the gyromagnetic ratios for spin types A and B. In the field cycling method, the matching condition is achieved by rapidly lowering the magnetic field to the value 0. This results in a more coherent transfer of the spin polarization between A and B.

Cross polarization and field cycling function only when the spins in question are permanently dipolar-coupled; i.e., the corresponding spins must not move relative to one another. In practice, this is best achieved for solids. For example, the gain factor for $^{13}C$ nuclear magnetization, which is dipolar-coupled to a single proton, is intensified by a factor of 4 following a process for cross polarization.

The anions A that are nuclear spin-polarized in this manner may then be stored on account of their long longitudinal T$_1$ times, or may be added to a suitable solvent and then used as NMR or MRT probes.

By use of the method, for the first time a contrasting agent for MRT or NMR tests is provided, depending on the type of solid or solvent selected, having T$_1$ times in the range of 10 min ($^6Li^+$ in water, for example) to several hours ($^6Li^+$ in LiD, $^{29}SiO_4$ solid, for example) and even longer.

The method is advantageously used so that the components of the gas mixture ($^4$He, $N_2$, and lithium and alkali metal vapor) are introduced into the sample cell in such a way that the mixture has little or no contact with the inner walls of the sample cell.

To this end, the gas mixture may be introduced into the sample cell as an open jet. The term "open jet" encompasses a jet that expands in the sample cell, or a protected jet that is designed to have little or no contact with the inner walls of the sample cell compared to the prior art. For this purpose, a protective blanket stream composed of an inert gas, for example $N_2$ and/or $^4$He, may be led into the sample cell to separate the mixture from the inner walls.

Such measures are practical due to the fact that hot lithium vapor is extremely reactive.

The laser light may preferably irradiate the sample cell perpendicular to the direction of flow of the mixture flowing in the sample cell. The magnetic field necessary for the optical pumping is selected to be parallel to the direction of propagation of the laser. The lithium atoms produced may then be pumped, oxidized, and deposited as ions without spatial diversions or deviations.

An apparatus according to the invention is made of sapphire or sapphire-coated quartz glass, or of other transparent, lithium- and temperature-resistant materials as an inner lining of the sample cell.

The inner walls of the sample cell that may come into contact with hot Li vapor are advantageously made of Li-resistant materials.

The apparatus may have at least one means that conducts the components of the mixture, composed of optically pumpable alkali metal species, nuclei to be hyperpolarized, and/or other inert gases, into the sample cell in such a way that the mixture does not contact the inner walls of the sample cell.

For this purpose, the apparatus may be advantageously characterized by at least one nozzle as the means.

Such means form an expanding open jet when the mixture is injected into the sample cell.

In addition, the means may form a blanket stream for the mixture that protects against wall contact.

The laser or lasers are advantageously positioned in the apparatus for hyperpolarizing the lithium atoms in such a way that the laser light irradiates the sample cell perpendicular to the direction of flow of the mixture.

The inlet window(s) in the sample cell for the laser light are located at the greatest possible distance from the inlet in the sample cell for the alkali metal species.

The apparatus has at least one supply container for alkali metals. A system in which at least two supply containers are provided is particularly advantageous: one supply container for a first type of alkali metal and at least one additional supply container for lithium.

In a further advantageous embodiment of the invention, the apparatus has at least two heating systems: one for the supply container for the first alkali metal, and the second for the lithium supply container.

The invention is described in greater detail below with reference to illustrated embodiments and the accompanying figures.

DETAILED DESCRIPTION OF THE DRAWINGS

Figure 1:
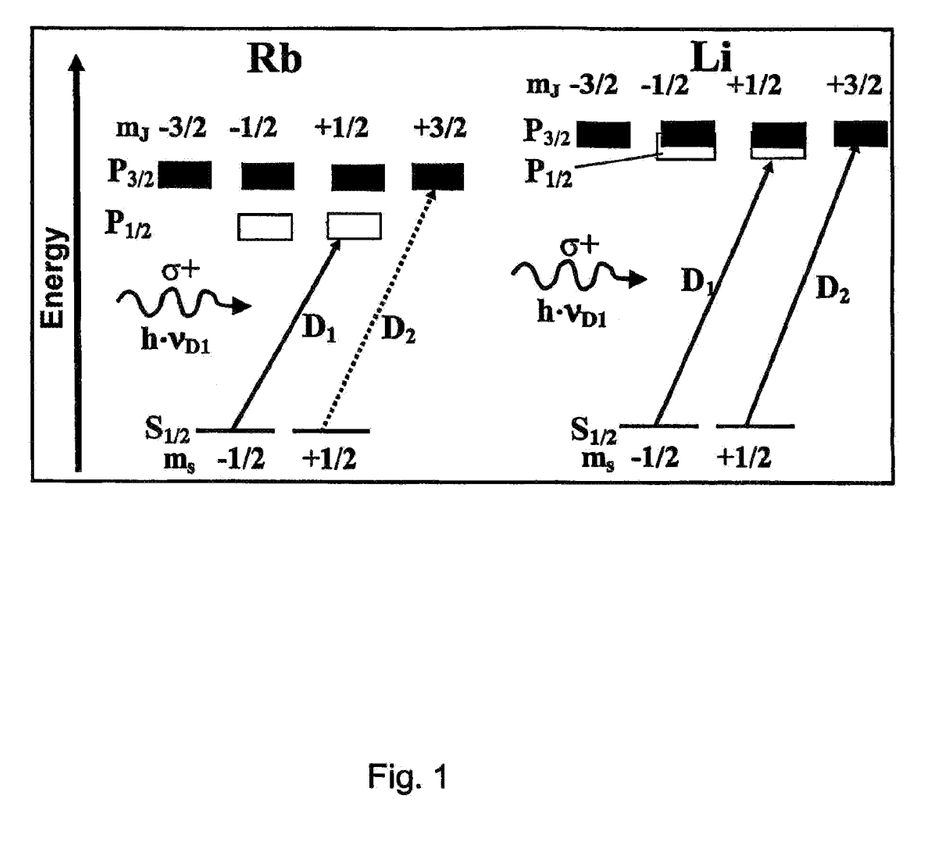
FIG. 1 is a set of two energy level diagrams showing and comparing the energy levels of Rb and Li during the optical pumping of electrons and the subsequent spin exchange from Rb to Li according to the present invention.

FIG. 1 schematically shows the energy level diagram of Rb and Li. It is seen that for Rb and at gas pressures <10 bar the $D_1$ and $D_2$ lines are energetically separate; i.e., only the $D_1$ line is pumped. In contrast, for Li the upper energy levels of the $D_1$ and $D_2$ transitions overlap, and therefore both original condition levels are pumped out.

As shown in Table 1, for Li the optical $D_1$ and $D_2$ energy levels are very close to one another. In other words, for moderate buffer gas pressures (>50 mbar) and at higher Li concentrations the $D_1$ or $D_2$ lines overlap due to collision broadening. Therefore, Li atoms in the gaseous phase cannot be directly optically pumped at higher pressures or at higher concentrations. This means that, for example, for circularly polarized pump light both original conditions ($S=+\frac{1}{2}$. $S=-\frac{1}{2}$) of the Li atom are simultaneously pumped, and the resulting overall polarization of the Li original condition is therefore virtually zero.

Figure 2:
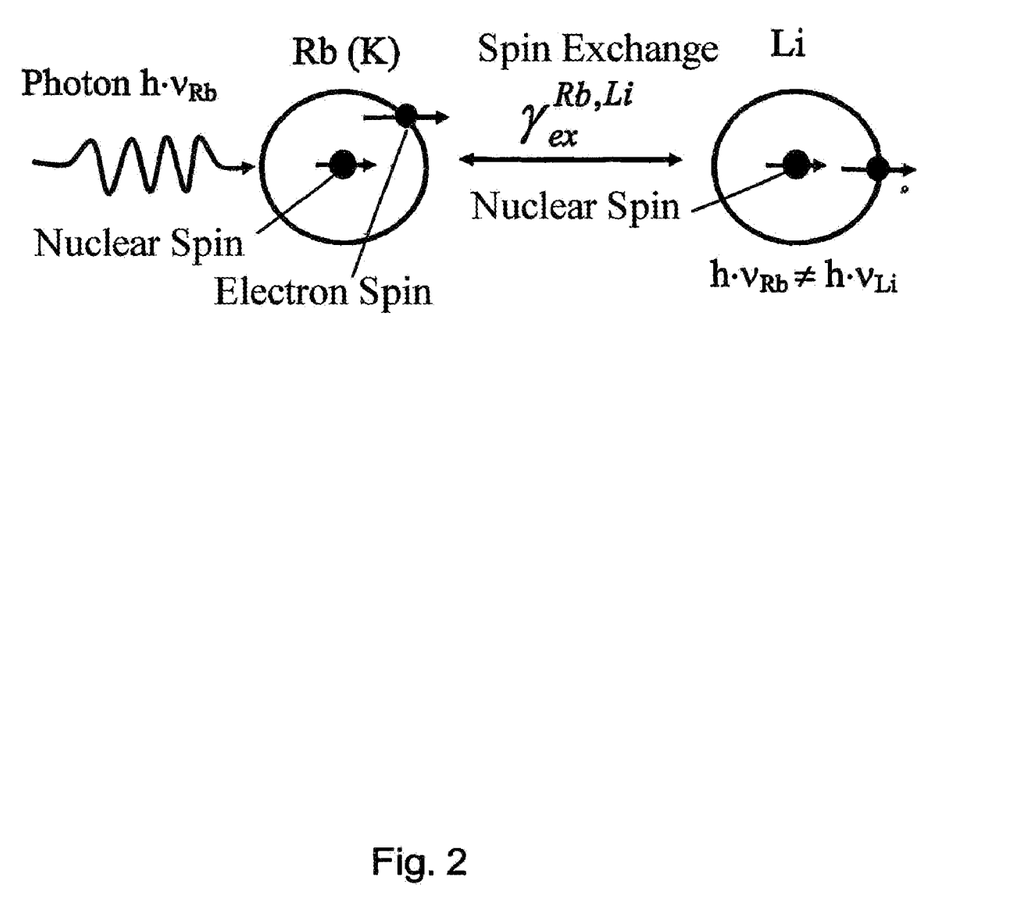
FIG. 2 is a schematic diagram illustrating the mechanism for the optical pumping of electrons and the subsequent spin exchange from Rb or K to Li according to the present invention.
Figure 3:
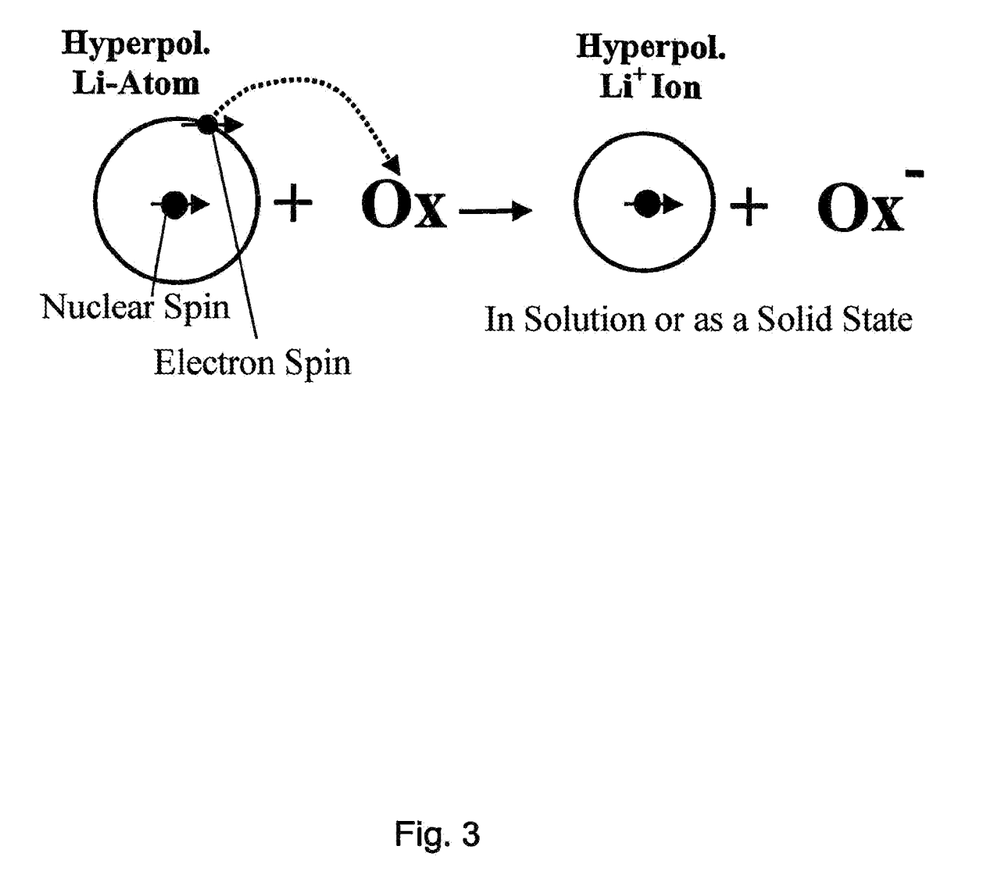
FIG. 3 is a schematic diagram showing the oxidation of the hyperpolarized Li atoms to form Li ions, either in solution or as a solid.

FIGS. 2 and 3 schematically show the principle according to the invention of hyperpolarization of the lithium atoms, and the subsequent oxidation as the basis for accumulation and production of further hyperpolarized nuclei.

According to the invention, Li is optically pumped not directly, but, rather, indirectly with a second type of alkali metal. The mechanism of this indirect optical pumping is illustrated in FIG. 2.

A further type of alkali metal (Rb, K, Cs) that may be effectively pumped is polarized by the laser. As the result of collisions, spin exchange takes place between the optically pumped electron of the alkali metal atom in the original condition and the electron of the Li atom in the original condition. This polarization exchange between Rb and Li occurs at a rate of $\gamma_{ex}^{Rb, Li}$. This electron-electron spin exchange advantageously occurs at any given buffer gas pressure of $^4$He, for example, as well as for high particle densities of the Li atoms.

No experiments are known from the prior art involving indirect optical pumping between alkali metal atoms and Li atoms.

The main drawback has been technical difficulties associated with the very corrosive, hot Li vapor. To date, this has prevented an analysis of the hyperpolarization of lithium.

A major advantage of indirect optical pumping, however, is that the Li particle concentration may be very high ($10^{17}$ cm$^{-3}$, for example) and still allow efficient indirect polarization at a moderate Rb density ($10^{15}$ cm$^{-3}$, for example).

Starting with the high-density Li vapor polarized in this manner, the lithium atoms are oxidized (see FIG. 3).

The key factor in the electron removal from the Li atom by the oxidizing agent Ox is that during the electron transfer process the nuclear spin polarization of the Li atom is maintained despite the redox reaction.

According to Table 2, the nuclear spin of the $^6$Li atom at its shell electron is coupled to the hyperfine coupling constant of 228 MHz. In other words, a hyperfine period of the hyperfine interaction lasts approximately 4.3 ns. Since this period is more than 1000 times longer than the time for the electron transfer, the nuclear spin is essentially not influenced at all, and the nuclear spin polarization is therefore maintained. Under the assumption that, although additional relaxation channels exist, for example the spin rotation coupling of the lithium molecule, the Li ion dissolves in the aqueous phase or forms the ionic solid (lithium salt) more rapidly than the $T_1$ time of the lithium molecules or salts, ultimately the $^6$Li nuclear spin polarization in the compound or in solution is largely maintained. A sufficient quantity of stored $^6$Li nuclear spin polarization is achieved.

By use of this combination method, namely, hybrid optical pumping followed by the electron transfer process (oxidation), a polarization level of the Li ions of greater than 50% and as high as 90% is achieved in a very particularly advantageous manner.

The method is explained in detail below, using the example of the production, accumulation, and storage of hyperpolarized $^6$Li ions by optical pumping of Rb.

Figure 4:
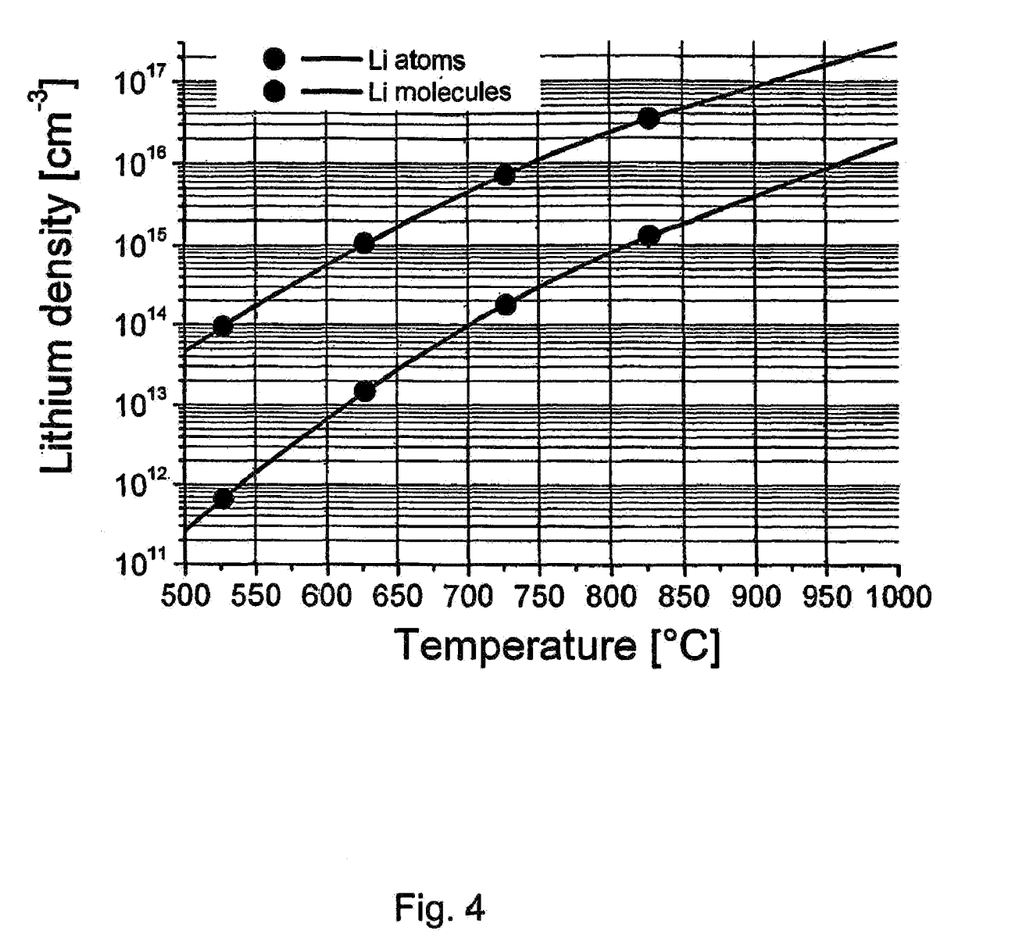
FIG. 4 is a set of graphs of two graphs, one for Li atoms and the other for Li molecules, plotting temperature in degrees C. against the density of the hyperpolarized lithium expressed in cubic centimeters thereby establishing that Li density is a function of temperature.

Firstly, a gas stream composed of He, $N_2$, Rb, and Li having a sufficiently high alkali metal density must be produced. The Li density of the gas stream may be approximately $10^{17}$ cm$^{-3}$, for example. This corresponds to a vaporization temperature of ~900° C. For the Rb density, approximately 1015 cm$^{-3}$ is sufficient, corresponding to T~200° C. The Li density is illustrated as a function of temperature in FIG. 4.

Hot Li vapor attacks essentially all the container walls of the optical pump cell. Standard Pyrex or Duran glass would therefore be completely unsuitable. One example of a possible material for the optical pump cell is quartz glass having an inner coating of sapphire ($Al_2O_3$), or a sapphire cell as such.

The indirectly optically polarized Li vapor may be converted in the form of ions to a solid without loss of polarization. For example, the Li atom may be reacted with a gaseous reactant Ox such as $Cl_2$ or $D_2$ gas, and be deposited as a solid salt (LiD or LiCl). The longitudinal $T_1$ relaxation time of the Li ions in the solid should be as long as possible in order to minimize polarization losses during the accumulation period.

Figure 5:
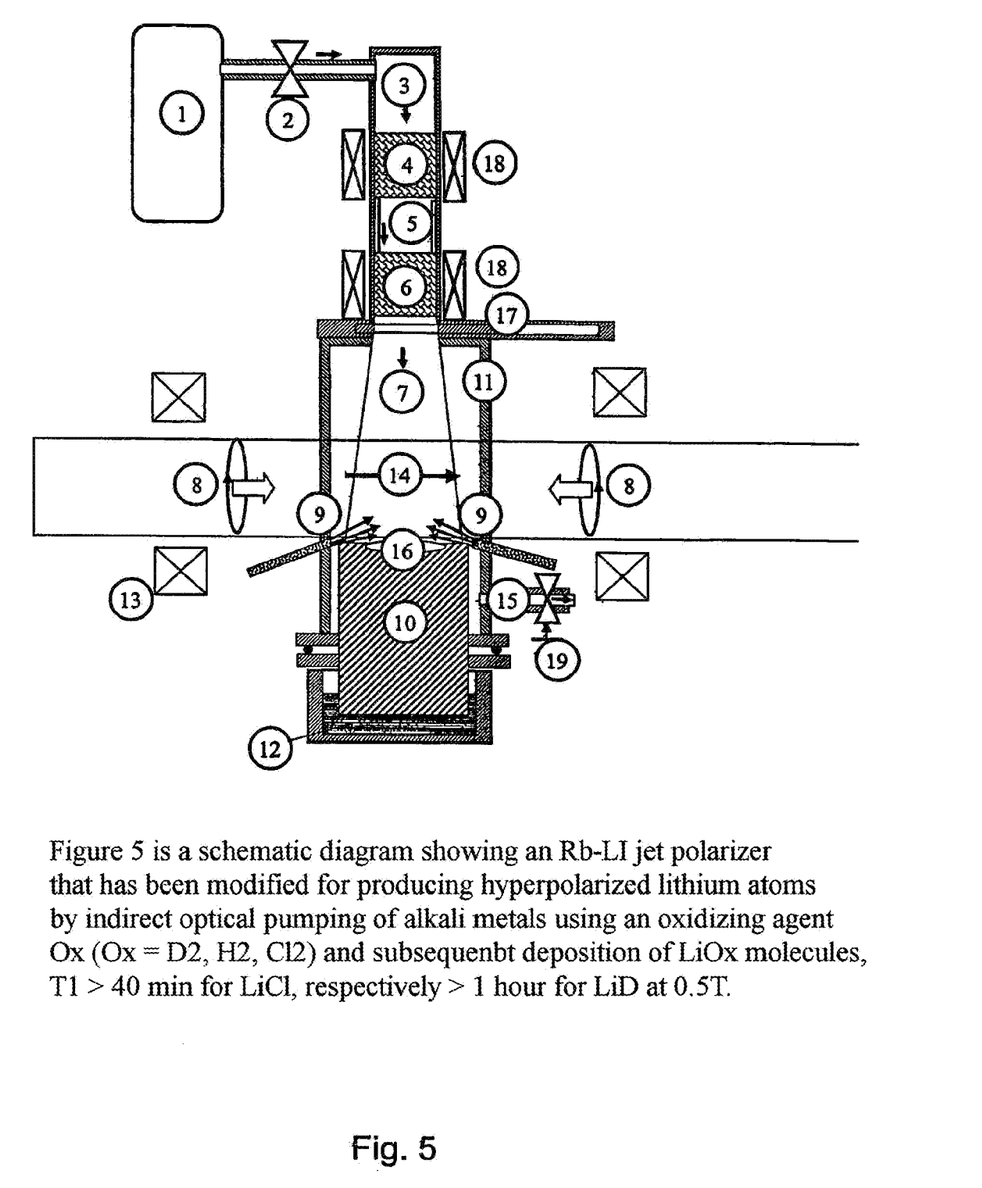
FIG. 5 is a schematic diagram showing an Rb—Li jet polarizer according to the present invention that has been modified for a production process for hyperpolarization of Li by indirect optical pumping of alkali metals.

FIG. 5 shows an Rb—Li jet polarizer according to the invention that has been modified for the production process for hyperpolarization of lithium by indirect optical pumping of alkali metals.

In the method, the gas mixture 3 is led from a container 1, containing $N_2$ gas at approximately 0.1 bar and $^4$He gas at 1-10 bar, into an Rb reservoir 4. The nitrogen is used for quenching during the optical pumping. The Rb reservoir is inductively heated to 200° C. by means of a coil 18, thus achieving an Rb density of approximately $10^{15}$ cm$^{-3}$. The gas stream 5 containing Rb, $^4$He, and $N_2$ passes into an Li reservoir 6, which is heated to a temperature of approximately 900° C. by means of an additional coil 18. This approximately corresponds to an Li density of $10^{17}$ cm$^{-3}$. The gas stream thus obtained, composed of Li, Rb, $^4$He, and $N_2$, is expanded as an open jet 7 through a nozzle into the optical pump cell. The nozzle has a diameter of 15 mm, for example. The open jet 7 expands in the optical pump cell, i.e., sample cell 11, the open jet 7 making very little contact with the walls of the cell 11. In this manner a reaction, i.e., the depolarization, of the Li or Rb atoms at the walls is avoided.

According to the invention, the sample cell is composed of $Al_2O_3$ or $Al_2O_3$-coated quartz glass or other transparent, lithium- and temperature-resistant materials.

Typical gas flow rates of the mixture are approximately 100 cm$^3$ min$^{-1}$.

Directly behind the inlet into the sample cell 11, the Rb atoms in the gas stream 7 are optically polarized on the Rb $D_1$ line with circularly polarized light 8, entering perpendicularly with respect to the jet 7, from two lasers. The optically pumped Rb atoms are situated in a magnetic field 14, generated by a Halbach magnet 13, having a field direction parallel to the direction of irradiation from the laser 8 and oriented perpendicular to the direction of the gas stream. The polarized Rb atoms polarize the Li original condition via electron-electron spin exchange. This exchange process occurs rapidly, typically in a period of 100 µs or less; for the Li atoms, the polarization times by means of spin exchange are significantly shorter than the longitudinal spin relaxation times for the Rb or Li electrons. Since the $^4$He gas pressure is freely selectable (0.1-10 bar), inexpensive, approximately 2-nm broadband semiconductor lasers may be used for the optical pumping.

An oxidizing agent, for example $D_2$ or $H_2$, $Cl_2$, etc., is then mixed with the hyperpolarized gas mixture containing Rb and Li. The oxidizing agent is admixed through feed lines 9, provided on the sides of the sample cell 11, at an angle of approximately 45° in counterflow to the flow direction. It is seen that the admixture takes place at the outlet of the sample cell 11.

The oxidizing agent $D_2$ oxidizes the lithium or Rb atoms, resulting in LiD or RbD molecules, respectively. These molecules pass into a trap 10 cooled by liquid $N_2$ or water 12, where they deposit as LiD solids. In the case of $H_2$ or $Cl_2$ as oxidizing agent, LiH or LiCl are respectively deposited.

The deposition process occurs in a magnetic field greater than 0.1 T (see Halbach magnet 13), since otherwise the $T_1$ times for the Li nucleus in the solid would be too short. For fields >0.1 T, the particularly long $T_1$ time of the $^6$Li (or $^7$Li) ion in the solid, which for $^6$LiCl at 0.4 T and 77 K, for example, is greater than one hour, is advantageous. An experimental determination of the $T_1$ time for $^6$LiD at 77 K has not yet been performed; the $T_1$ time of $^6$LiD at T<1 K and 0.4 T is known (approximately 2000 h).

Thus, the method according to the invention opens up completely new options.

The gaseous products (He, $N_2$, $H_2$, $Cl_2$, HD, and possibly $O_2$) are discharged via an exhaust line and through a needle valve 15. Continuous gas flow may be controlled by means of the needle valve 15. In the last step, for example, hyperpolarized LiD (LiCl) may be mixed with water, resulting in hyperpolarized Li$^+$ or OH$^-$ (Cl$^-$) ions in solution and released HD gas.

An accumulated total number of hyperpolarized Li$^+$ ions of $5 \cdot 10^{20}$ may be achieved in the manner described.

The accumulation of hyperpolarized $^6$LiCl salt with transfer to anions, together with a typical application example from the medical field, is provided as an illustrated embodiment for the method according to the equivalent claim.

The flow rate of the hyperpolarized $^4$He, $L_1$, $N_2$, Rb gas stream 7 having an Li density of $10^{17}$ cm$^{-3}$ is 100 cm$^3$/min at 7 bar total pressure. An $^4$He—$Cl_2$ gas mixture, likewise at 7 bar total pressure, and a $Cl_2$ partial pressure of 0.1 bar continuously flows through feed lines 9 into the gas space of the sample cell 11, where it reacts with the hyperpolarized Rb and Li atoms to form LiCl or RbCl molecules, respectively. The RbCl or LiCl molecules then deposit in the form of a salt on the cold cooling element 10. For an accumulation time of 10 min, for example, 1000 cm$^3$ of Li vapor having a density of $10^{17}$ cm$^{-3}$ is deposited in the form of solid LiCl. This corresponds to an accumulated total number of approximately $10^{20}$ hyperpolarized Li ions.

The hyperpolarized LiCl salt may, if necessary, be completely dissolved in cooled water, for example, and be directly supplied as an Li NMR probe of a sample; for example, it may be injected into a patient to be tested. Since the $T_1$ time of $^6$Li in water is approximately 10 min, the $^6$Li$^+$ ion, for example, may pass into the human brain or an organ without great loss of polarization, and may then be tested using Li MRT.

In principle, all halides, such as $I_2$, $Br_2$, $Cl_2$, or $F_2$ gas, and possibly also simple organic molecules such as $CH_4$, for example, may be considered as alternative oxidizing agents. Practically all Li halide salts have long $T_1$ times (for example, $T_1$=40 min for $^7$LiCl). This opens up the entire chemistry of possible Li oxidation processes or electron transfer processes.

The suitability thereof as hyperpolarized Li salts in nuclear spin resonance depends on the particular Li $T_1$ times, their solubility in the selected solvent, and lastly, their biocompatibility.

For hyperpolarization of other important nuclei for NMR or MRT, for example $^{13}$C, $^{29}$Si, or $^{31}$P, the hyperpolarized Li ions are used as polarization medium.

If nuclear spin-polarized LiCl in solution, for example, is combined with other anions A (where A is $CO_3^{2-}$, $SiO_4^{4-}$, $PO_4^{3-}$, for example), subsequent evaporation of the solvent results in the corresponding $Li_xA_y$ salts $Li_2CO_3$, $Li_4SiO_4$, and $Li_3PO_4$, among others. The longitudinal $T_1$ times of the $^6$Li, $^{13}$C, $^{29}$Si, and $^{31}$P nuclei in the $Li_xA_y$ solid are long, ranging from several minutes to hours. Examples of $T_1$ times for the nuclei in question are listed in Table 2.

In the ionic $Li_xA_y$ solid, the large Li$^+$ nuclear spin polarization may then be transferred to the $^{13}$C, $^{29}$Si, or $^{31}$P nuclear spin in a highly efficient manner by cross polarization or by use of the field cycling method. Typically, 50% of the Li nuclear spin polarization may thus be transferred to the other nuclei. On account of their long $T_1$ times, the anions A that are nuclear spin-polarized in this manner may then be reintroduced into a suitable solvent and used as NMR or MRT probes.

It is understood that the reactants and method steps referenced in the illustrated embodiments are to be construed strictly as examples.

One skilled in the art may readily adapt individual method steps and parameters (temperatures, densities, flow rates, reactants) in order to obtain other lithium salts or nuclei. Thus, adaptation to specific problems and experimental objectives is easily possible.

With regard to dissolving the compound in biocompatible and other solvents for producing contrasting agents, and the methods of cross polarization or field cycling, reference is made to the literature.

Figure 6:
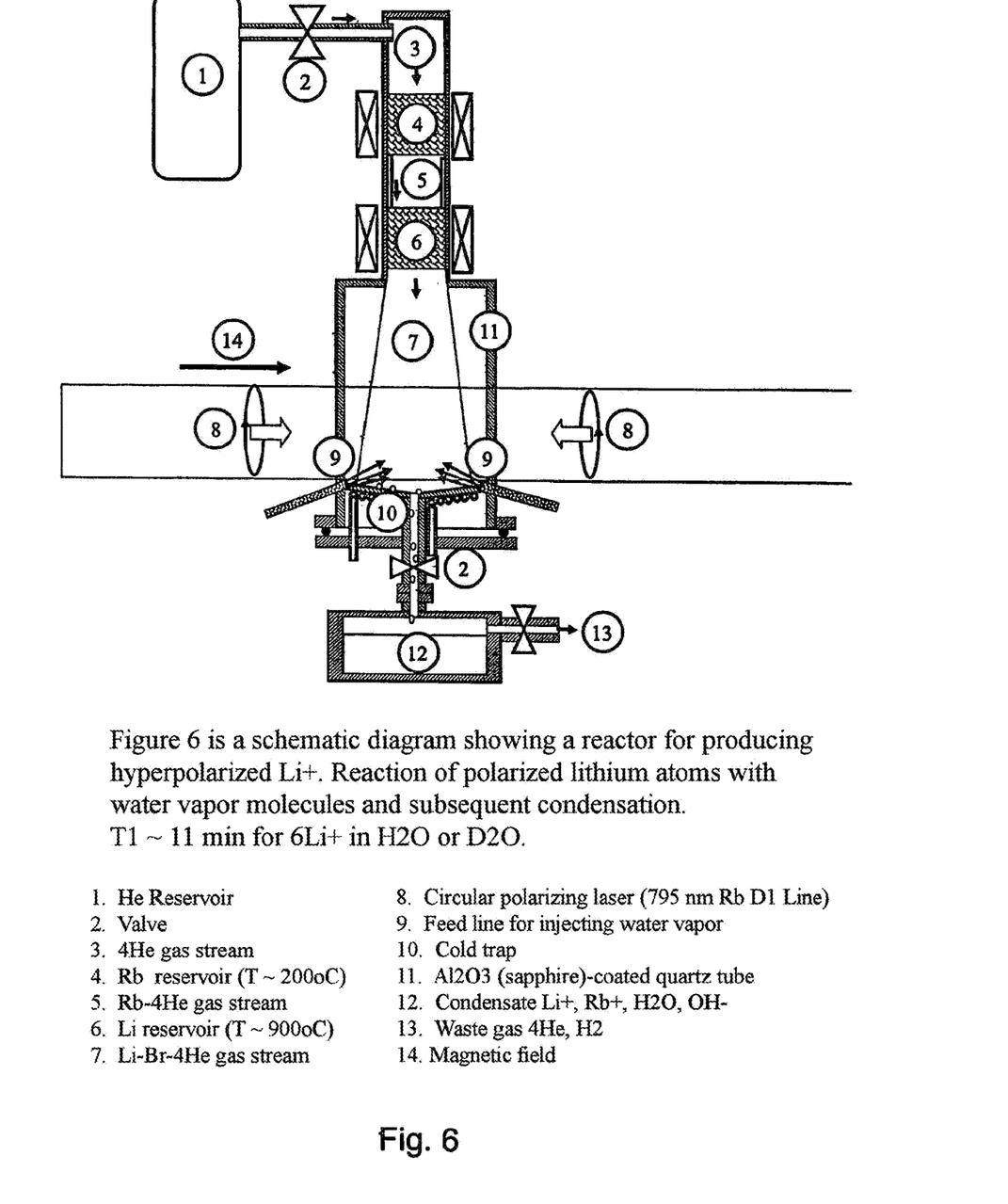
FIG. 6 is a schematic diagram showing an alternative apparatus according to the present invention for a production process for hyperpolarization of Li by indirect optical pumping of alkali metals.

Also possible, for example, is the apparatus shown in FIG. 6, by means of which the method according to the invention for hyperpolarization of lithium atoms may likewise be carried out.

Figure 7:
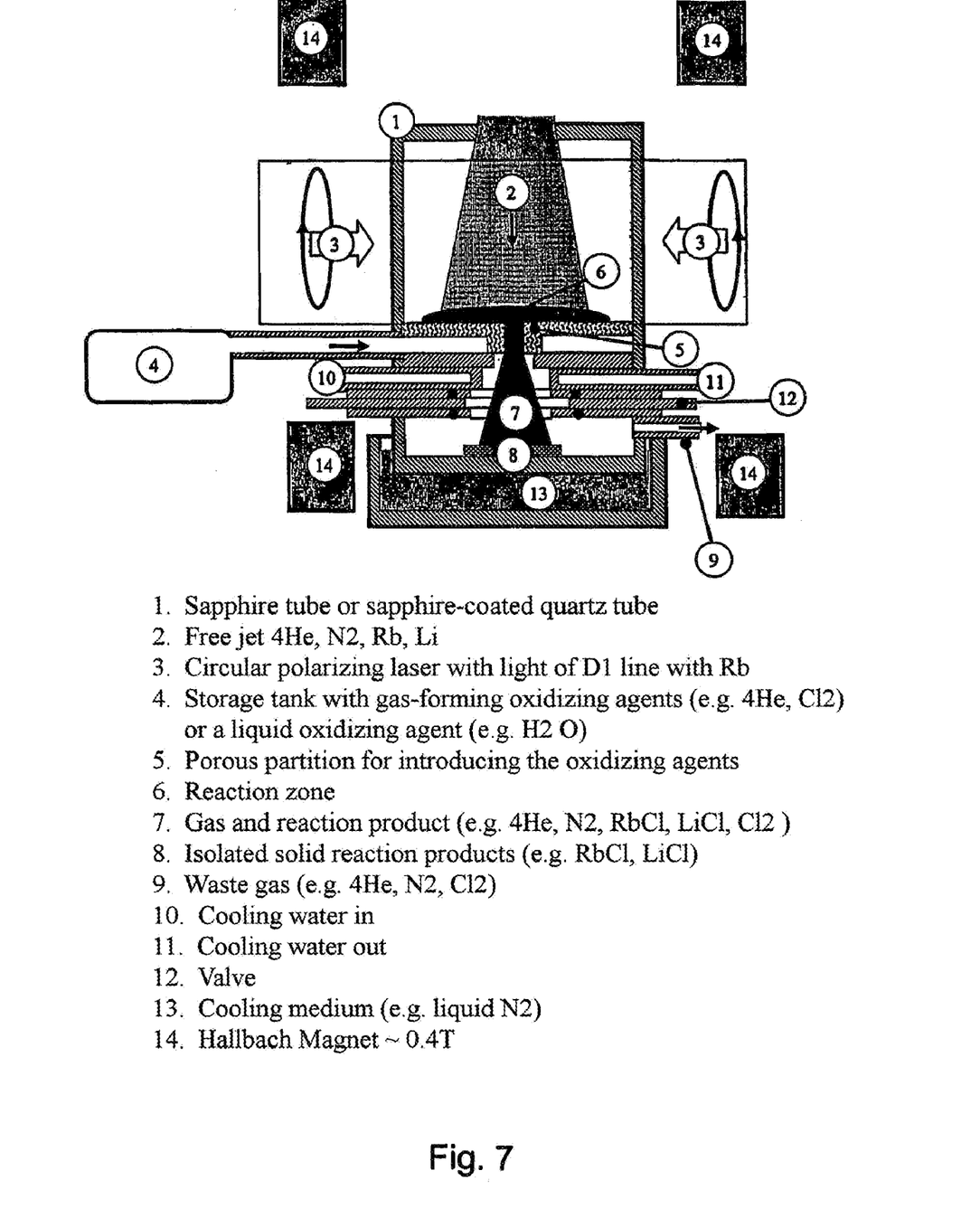
FIG. 7 is a schematic diagram showing the reaction zone in which hyperpolarized Li is oxidized to Li ions.

FIG. 7 shows an enlargement of a section of the reaction zone in which the hyperpolarized lithium is oxidized. According to the figure, at the location above the feed line for the oxidizing agent porous walls 5 are provided, through which the oxidizing agent is introduced, for example in the form of a highly concentrated liquid. The porous wall 5 results in fine dispersion and turbulence as well as formation of a reaction layer. The porous wall leaves an opening in the middle of the sample cell (a sapphire tube, for example) through which the gas and reaction products pass and are deposited as lithium salt 8.

The same as for the other illustrated embodiments, by continuous oxidation and introduction of the gas mixture into the cold trap, using $N_2$ or $H_2O$, for example, as coolant, in a magnetic field >0.05 T, Li atoms are accumulated in relevant quantities (for example, up to $5 \cdot 10^{20}$) in the form of the corresponding lithium salt.

For FIG. 7, at this location it is possible to add instead of oxidizing agent $H_2CO_3$, $H_3PO_4$, or $H_4SiO_4$, or a highly concentrated salt solution of the anions $CO_3^{2-}$, $PO_4^{3-}$, or $SiO_4^{4-}$. In this manner it appears possible to obtain the anion nuclei without the intermediate step of the lithium halide salts. Any condensate that results may be removed by withdrawing the corresponding solvent, and a solid may be used for transferring polarization to the anion nuclei.

According to these embodiments, the entire process may be carried out, at least partially, in a liquid phase instead of a purely gaseous phase.

The invention claimed is:

1. A method for hyperpolarization of lithium atoms in a mixture by optically pumping in a sample cell, comprising the steps of:
    (a) optical pumping of atoms of a first type of alkali metal and spin exchange from the optically pumped electron of this alkali metal to the electron of the lithium atom and
    (b) oxidizing the lithium atoms to Li$^+$ ions.

2. The method according to claim 1, further comprising the step of
    transferring the nuclear spin polarization of the Li$^+$ ions to a nuclear spin of an anion.

3. A method for producing nuclear spin-polarized substances, the method comprising the steps of:
    hyperpolarizing lithium atoms by optical pumping of atoms of a first type of alkali metal in a sample cell and by spin exchange of the optically pumped electron of this alkali metal to the electron of the lithium atom,
    oxidizing the lithium atoms to Li$^+$ ions, and
    transferring the nuclear spin polarization of the Li$^+$ ions to another nucleus of an anion.

4. The method according to claim 1, wherein the optical pumping is effected by means of laser light.

5. The method according to claim 1 wherein the mixture contains $N_2$ and $^4$He in addition to the first type of alkali metal and lithium.

6. The method according to claim 3 wherein the mixture contains $^3$He, the method further comprising the step of:
    polarizing the nuclear spin of the $^3$He gas via the indirectly optically pumped Li ions.

7. The method according to claim 1 further comprising the step of:
    selecting Rb, Cs, or K atoms as the first type of alkali metal.

8. The method according claim 1
    wherein the first type of alkali metal in the sample cell has a density of $10^{11}$ cm$^{-3}$ to $10^{15}$ cm$^{+3}$.

9. The method according to claim 1 wherein the lithium atoms in the sample cell have a density of $10^{14}$ cm$^{-3}$ to $10^{18}$ cm$^{-3}$.

10. The method according to claim 3,
wherein the hyperpolarized lithium atoms are $^6$Li or $^7$Li atoms.

11. The method according to claim 1, wherein according to step (a)
a temperature of >500° C. is employed during the optical pumping.

12. The method according to claim 1, wherein according to step (b)
the hyperpolarized lithium atom is oxidized by $Cl_2$, $I_2$, $Br_2$, $D_2$, $H_2$, $H_2O$, $D_2O$, or an organic oxidizing agent to produce a corresponding lithium molecule or salt.

13. The method according to claim 12, further comprising the step of:
depositing the hyperpolarized lithium molecule as a solid or dissolved in a solution.

14. The method according to claim 13 wherein the deposition occurs in a magnetic field greater than 0.05 T.

15. The method according to claim 1, further comprising the step of accumulating up to $5 \cdot 10^{20}$ or more hyperpolarized $Li^+$ ions.

16. The method according to claim 2 wherein the anion comprises $^{13}C$, $^{29}Si$, $^{31}P$, or another nucleus having a long $T_1$ relaxation time.

17. The method according to claim 2, wherein $CO_3^{2-}$, $SiO_4^{4-}$, or $PO_4^{3-}$ obtained from an ionic solvent is selected as the anion.

18. The method according to claim 1, further comprising the step of:
introducing the hyperpolarized $Li^+$ ions and anions into a solvent.

19. The method according to claim 18, further comprising the step of
precipitating the $Li^+$ ions present in the solvent and/or the anions.

20. The method according to claim 18, further comprising the step of
precipitating a solid by evaporation of the solvent.

21. The method according to claim 2, wherein the nuclear spin polarization of the $Li^+$ ions is transferred to the nuclear spin of an anion by cross polarizing or by field cycling.

22. The method according to claim 21,
in which the nuclear spin polarization of the $Li^+$ ions in the solid is transferred to nuclei of the anion in the solid.

23. The method according to claim 1, further comprising the step of:
introducing the components of the mixture and/or inert components into the sample cell in such a way that the mixture containing the lithium atoms does not contact the inner walls of the sample cell.

24. The method according to claim 1, further comprising the step of:
introducing the mixture into the sample cell as an open jet.

25. The method according to claim 1 wherein a blanket stream composed of an inert gas is led into the sample cell to separate the mixture containing the lithium atoms from the inner walls.

26. The method according to claim 4 wherein the laser light irradiates the sample cell perpendicular to the direction of flow of the mixture flowing in the sample cell.

27. An apparatus for carrying out hyperpolarization of lithium atoms and oxidation of the hyperpolarized lithium atoms to obtain hyperpolarized lithium ions, which comprises
(a) a sample cell having a sapphire or sapphire-coated quartz glass inner wall;
(b) at least one means for conducting components of a mixture, composed of a first type of alkali metal as optically pumpable species, lithium atoms to be hyperpolarized, and/or other inert gases, into the sample cell;
(c) at least one laser capable of optically pumping the atoms of a first type of alkali metal and permitting spin exchange of the electrons of the optically pumped atoms of the first type of alkali metal with the electrons of the lithium atoms; and
(d) means for adding an oxidant to the hyperpolarized lithium atoms to oxidize the hyperpolarized lithium atoms to hyperpolarized lithium ions.

28. The apparatus according to claim 27, wherein the
at least one means for conducting the components of the mixture, composed of optically pumpable alkali metal species, lithium atoms to be hyperpolarized, and/or other inert gases, into the sample cell which conducts the components of the mixture in such a way that the mixture does not contact the inner wall of the sample cell.

29. The apparatus according to preceding claim 28, wherein at least one nozzle is the means.

30. The apparatus according to claim 28 wherein the means form an expanding open jet for injecting the mixture into the sample cell.

31. The apparatus according to claim 28 wherein the means form a blanket stream for the mixture.

32. The apparatus according to claim 27 wherein
the at least one laser is positioned in such a way to emit laser light that irradiates the sample cell perpendicular to the direction of flow or in counterflow to the mixture.

33. The apparatus according to claim 27 wherein an inlet window in the sample cell for the laser light is located at the greatest possible distance from an inlet in the sample cell for the alkali metal atoms.

34. The apparatus according to claim 27 further comprising at least one supply container for alkali metals.

35. The apparatus according to claim 34, wherein the supply container for alkali metal and/or lithium is situated in a supply line for the apparatus.

36. The apparatus according to claim 27 further comprising at least two heating systems, one for lithium and the other for the first alkali metal.

* * * * *